United States Patent [19]

Larkin et al.

[11] Patent Number: 5,363,800

[45] Date of Patent: Nov. 15, 1994

[54] PROCESS FOR THE CONTROLLED GROWTH OF SINGLE-CRYSTAL FILMS OF SILICON CARBIDE POLYTYPES ON SILICON CARBIDE WAFERS

[75] Inventors: David J. Larkin, Fairview Park; Powell, J. Anthony, North Olmsted, both of Ohio

[73] Assignee: The United States of America as represented by the United States National Aeronautics and Space Administration, Washington, D.C.

[21] Appl. No.: 973,505

[22] Filed: Nov. 9, 1992

Related U.S. Application Data

[63] Continuation-in-part of Ser. No. 718,315, Jun. 12, 1991, abandoned.

[51] Int. Cl.$^5$ .................... H01L 21/306; H01L 21/20
[52] U.S. Cl. .......................... 117/95; 117/97; 117/101; 117/106; 117/913; 117/923; 117/951; 437/100; 148/DIG. 168; 148/DIG. 148
[58] Field of Search ............. 156/612; 148/DIG. 168, 148/DIG. 148; 437/100; 117/95, 97, 106, 913, 923, 101, 951

[56] References Cited

U.S. PATENT DOCUMENTS

| | | | |
|---|---|---|---|
| 3,956,032 | 5/1976 | Powell et al. | 148/175 |
| 4,333,792 | 6/1992 | Smith | 156/612 |
| 4,612,072 | 9/1986 | Morrison et al. | 156/612 |
| 4,855,254 | 8/1989 | Eshita et al. | 473/100 |
| 4,865,659 | 9/1989 | Shigeta et al. | 148/33 |
| 4,866,005 | 9/1989 | Davis et al. | 437/100 |
| 4,912,063 | 3/1990 | Davis et al. | 437/100 |
| 4,912,064 | 3/1990 | Kong et al. | 437/100 |
| 4,946,547 | 8/1990 | Palmour et al. | 156/643 |
| 5,190,613 | 3/1993 | Yamagata | 156/612 |
| 5,200,022 | 4/1993 | Kong | 156/612 |
| 5,230,768 | 7/1993 | Furukawa et al. | 156/612 |
| 5,248,385 | 9/1993 | Powell | 156/612 |

FOREIGN PATENT DOCUMENTS

270398 11/1988 Japan .................. 156/612

OTHER PUBLICATIONS

V. J. Jennings et al, The Epitaxial Growth of Silicon Carbide; Journal of the Electrochemical Society, Jul. 1966, p. 730.

J. A. Powell et al, Growth of Improved Quality 3C–SiC Films on 6H–SiC Substrates Appl. Phys. Lett. 56(14), 2 Apr. 1990.

J. A. Powell et al, Growth of High Quality 6H–SiC Epitaxial Films on Vicinial (0001) 6H–SiC Wafers; Appl. Phys. Lett 56(15), 9 Apr. 1990.

J. A. Powell et al, Silicon Carbide, A Semiconductor for Space Power Electronics NASA Technical Memorandum 103655, Jan. 6–10, 1991.

J. A. Powell et al, Controlled Growth of 3C–SiC and 6H–SiC Films on Low–Tilt–Angle Vicinal (0001) 6H–SiC Wafers, Appl. Phys. Lett. 59(3), 15 Jul. 1991.

*Primary Examiner*—R. Bruce Breneman
*Assistant Examiner*—Linda J. Fleck
*Attorney, Agent, or Firm*—Gene E. Shook; Guy M. Miller; James A. Mackin

[57] ABSTRACT

This invention is a method for the controlled growth of single-crystal semiconductor-device-quality films of SiC polytypes on vicinal (0001) SiC wafers with low tilt angles. Both homoepitaxial and heteroepitaxial SiC films can be produced on the same wafer. In particular, 3C-SiC and 6H-SiC films can be produced within selected areas of the same 6H-SiC wafer.

36 Claims, 4 Drawing Sheets

PROCESS FOR THE CONTROLLED GROWTH OF SINGLE-CRYSTAL FILMS OF SILICON CARBIDE POLYTYPES ON SILICON CARBIDE WAFERS

ORIGIN OF THE INVENTION

This invention was made by employees of the United States Government and may be made or used by the Government of the United States without a payment of royalties thereon or therefore.

This application is a continuation-in-part of application Ser. No. 07/718,315, filed Jun. 12, 1991, now abandoned.

TECHNICAL FIELD OF THE INVENTION

This invention relates to the controlled growth of single-crystal semiconductor-device-quality films of silicon carbide (SIC) polytypes on a SiC wafer. More specifically, it relates to a new process for growing by chemical vapor deposition (CVD), a single-crystal low-defect-density film of 3C-SiC, or areas of 3C-SiC within selected boundaries of a 6H-SiC film on a low-tilt-angle vicinal (0001) 6H-SiC wafer.

BACKGROUND OF THE INVENTION

Silicon carbide possesses properties that should make it a superior semiconductor for applications that involve high temperature, high power, high radiation and/or high frequency (See *Amorphous and Crystalline Silicon Carbide* and *Amorphous and Crystalline Silicon Carbide II*). In addition, a variety of optical devices (e.g. light-emitting diodes, LEDs) can be fabricated from SiC and operated at high temperature. The properties that allow this superior performance are its large bandgap, excellent physical stability, high thermal conductivity, high electric breakdown field, and high saturated electron drift velocity. Semiconductor devices fabricated from SiC are capable of operating at temperatures above 600° C. which is well above the capability of current commercial semiconductors. Also, based on theoretical considerations, SiC microwave devices should be far superior to currently available devices. The potential market for SiC devices is very large and could exceed billions of dollars annually.

The chief obstacle to the commercialization of SiC has been the lack of control over its crystal growth. Several properties of SiC contribute to this lack of control. First, it does not melt at reasonable pressures; it sublimes at temperatures above 1800° C. Second, it grows in many different crystal structures, called polytypes.

The following defines some of the nomenclature used in this document. The SiC polytypes are formed by the stacking of double layers of Si and C atoms. Each double layer may be situated in one of three positions, designated as A, B, and C. The sequence of stacking determines the particular polytype and the stacking direction is called the crystal c-axis. There is one cubic polytype, with the zincblende structure and known as 3C or β SiC. It has a three-layer repeat sequence ABC..., and so forth. All of the other polytypes are known as α-SiC and have either a hexagonal or rhombohedral structure. The hexagonal 6H-SiC polytype has the six layer repeat sequence ABCACB..., and so forth. For the α-SiC polytypes, the (0001) plane is known as the basal plane, and this plane is perpendicular to the c-axis. The (111) plane of 3C-SiC is equivalent to the basal plane of the α-SiC polytypes. In the discussions of this document, "basal plane" shall refer to either the (0001) plane for α-SiC, or the (111) plane of 3C-SiC. Also, "3C" shall be used for 3C-SiC, and "6H" shall be used for 6H-SiC. It is well known that a SiC surface, which is approximately parallel to the basal plane, is terminated with either Si atoms (the surface called the Si face) or terminated with C atoms (the surface called the C face). The term "vicinal (0001) wafer" shall refer to SiC wafers whose misorientation (i.e. tilt angle) is less than 6° from the basal plane. The term "homoepitaxial" shall refer to epitaxial growth whereby the film and the substrate (wafer) are of the same polytype, and the term "heteroepitaxial" shall refer to growth whereby the film is of a different polytype than the substrate.

Since melt-growth techniques cannot be applied to SiC, vapor growth processes have been developed. An early SiC vapor-growth process, the Lely process, was based on the sublimation of polycrystalline SiC within a growth cavity and did produce rather pure crystals of various polytypes. Unfortunately, the crystals were too small, irregular in shape, and thus not suitable for commercial development. More recently, a high temperature sublimation process has been developed that does produce large single-crystal boules of 6H. Furthermore, polished wafers, more than 25 mm in diameter, can be produced from these boules. Commercial 6H-SiC devices are now being produced with these wafers.

Each of the various SiC polytypes has unique electrical and optical properties that can give it advantages over other polytypes in particular applications. For example, the 6H polytype has an energy bandgap of 2.9 eV and a hexagonal structure, whereas the 3C polytype has a lower bandgap, 2.2 eV, and a zincblende structure with a higher symmetry than 6H. These property differences lead to advantages for 6H in some applications (e.g. the wider bandgap—resulting in blue light emitting diodes, and possibly higher operating temperatures compared to 3C). On the other hand, the differences lead to advantages for 3C (higher electron mobility—leading to possibly higher frequency operation, and narrower bandgap—leading to lower forward voltage drop in some devices, compared to 6H). Thus it can be seen that it is desirable to develop devices based on 3C as well as 6H.

As of now, there is no existing method for producing single-crystal 3C boules. Hence, no 3C wafers are available. It is well known that single-crystal homoepitaxial 6H films can be grown in the lower temperature range 1400° C. to 1550° C. by chemical vapor deposition (CVD) on vicinal (0001) 6H wafers if the tilt angle is greater than about 1.5°. Typically 3° to 4° is used If the tilt angle is less than about 1° then a 3C film will be produced on the 6H wafer if prior art processes are used. However, the 3C film grown in this way generally has a high density of defects, including a defect known as double positioning boundaries (DPBs). This DPB defect can arise because of the change in stacking sequence of the 6H wafer (i.e. ABCACB ...) to that of the 3C (ABC ... or ACB ... ) film at the interface between the two polytypes. The difference between the two 3C sequences is a 60° rotation about the <111> axis. If both of these sequences nucleate on the 6H substrate, DPBs will form at the boundary between domains differing by the 60°.

A theoretical crystal growth model, proposed by Matsunami and which has been used to explain the formation of the 3C and 6H polytypes on vicinal (0001)

6H substrates, is based on the density of atomic-scale steps on the growth surface. According to this model, 6H grows on 6H when the tilt angle is greater than about 1° because terraces between steps are small and arriving molecules containing Si and C are able to migrate to steps where growth occurs. This growth is a lateral growth of the steps and reproduces the 6H substrate. For small tilt angles, say less than 1°, the terraces are larger and all molecules are not able to migrate to steps; instead, nucleation of 3C takes place on the terraces. Hence, for small tilt angles, 3C grows on 6H substrates. It has been reported that 3C films with reduced DPBs were grown on the as-grown face of 6H Lely-grown crystals, but in that case, it was assumed that the as-grown face was nearly atomically flat.

According to the model of Matsunami, nucleation of 3C on a given terrace would yield 3C nuclei with the same stacking sequence. Hence, no DPBs would be caused by the coalescence of such nuclei. In the case of polished wafers, the density of steps will always be relatively high, leading to a high density of DPBs. Thus, for the case of polished wafers, prior art teaches that a high density of DPBs is inevitable. There is generally a high density of stacking faults in the vicinity of DPBs indicating high stress in these regions. Also, films with high DPB density have a rough morphology. Such films are not suitable for device fabrication.

In the CVD growth of epitaxial SiC films on vicinal (0001) α-SiC wafers, a variety of pregrowth process have been used to prepare the polished surface for growth. The intent of these processes is to remove contamination and near-surface defects (from cutting and polishing the wafer) that contribute to poor quality films. Processes used to eliminate near-surface defects include molten-salt etching, oxidation followed by removal of the oxide with hydrofluoric acid, reactive ion etching, etc. prior to loading wafers into the CVD growth system. In situ processes (within the CVD growth system) include high temperature etching in $H_2$ or $HCl/H_2$ mixtures. All prior art use of these processes in CVD at temperatures less than 1600° C. has produced the heteroepitaxial growth of 3C on vicinal (0001) 6H if the tilt angle was less than 1°. In one case, Powell et al. used an HCl etch consisting 2 min at 1200° C. In another case, Matsunami et al. used an HCl etch consisting of 10 min at 1500° C. In both of these cases, 3C films were produced on vicinal (0001) 6H with tilt angles of less than 1°. It must be emphasized at this point that prior-art teaches that pregrowth surface treatments of substrates used in CVD processes, can be effective in reducing defects in the resulting film. Prior art has not taught that surface treatments can be a significant factor in controlling the polytype of CVD-grown SiC films.

U.S. Pat. No. 5,248,385 discloses that surface treatments can be used to obtain homoepitaxial growth of SiC polytyptes on SiC substrates (e.g. 6H-SiC on 6H-SiC) with low tilt angles.

Copending application Ser. No. 718,315 filed Jun. 12, 1991, now abandoned discloses that growth of SiC crystal polytypes can be controlled through the use of appropriate surface treatments for growth surfaces with low tilt angles. This application also teaches that the location of the intentional nucleation site on the intended growth surface is important and should be located preferably at the highest atomic plane. However, it does not teach that the tilt angle at this preferred location (i.e. the highest atomic plane) should have any preferred value (e.g. zero tilt angle).

Additionally, in the abandoned patent application describes several methods for producing intentional heteroepitaxial growth at the desired location. specifies "a prescribed localized alteration of the crystal substrate surface." Other methods specify that the substrate surface can be altered by (1) scratching or indenting the surface with a diamond tool, (2) striking an electric arc to the surface, and (3) heating the surface with a laser, an electron or ion beam, or some other sort of energy beam. All of these techniques damage the surface in one way or another and the resulting heteroepitaxial nucleation is difficult to control. Another method specifies that intentional heteroepitaxial nucleation can be generated by "the introduction of a suitable impurity at the site to stimulate the growth of a desired polytype (e.g. 2H-SiC, 3C-SiC, etc.)." In the "DETAILED DESCRIPTION OF A PREFERRED EMBODIMENT", it is suggested that the vapor-liquid-solid (VLS) method of growth can be used to produce a single crystal whisker of a desired polytype. The 2H-SiC polytype is given as an example. But, this suggestion does not teach any procedure for carrying out the heteroepitaxial growth using the VLS technique. To those skilled in the art, it is known that VLS has been used to produce only the homoepitaxial growth of SiC whiskers and not heteroepitaxial growth of SiC whiskers on SiC substrates. This prior art does not provide any procedure for producing an intentionally grown heteroepitaxial "seed" crystal at the preferred site of heteroepitaxial nucleation. Thus, it is obvious to those skilled in the art that improvements need to be made in the procedure for achieving intentional heteroepitaxial nucleation at the preferred nucleation site.

Additionally, in abandoned patent application Ser. No. 718,315 filed Jun. 12, 1991, the methods contained therein describe that the heteroepitaxy be carried-out using a suitable silicon-containing source and a carbon-containing source. This prior art does not teach that the ratio of the silicon-containing source to the carbon-containing source plays any role in enhanced intentional heteroepitaxial nucleation. Also, it does not teach that altering any of the other growth conditions (e.g. temperature) can have any effect on the intentional heteroepitaxial nucleation.

SUMMARY OF THE INVENTION

The present invention teaches new processes for the growth of SiC polytypes on low-tilt-angle vicinal (0001) SiC substrates. In particular, it describes processes for the intentional heteroepitaxial nucleation of SiC polytypes on SiC substrates. The present invention teaches that the intentional heteroepitaxial nucleation can be enhanced if an area zero tilt angle is created at the position of desired intentional heteroepitaxial nucleation.

In summary, the inventive method is comprised of five essential steps. First, cut and polish a SiC wafer such that the polished surface, either a Si face or C face, of the wafer is slightly misoriented (from near 0° to about 1°) from the SiC basal plane (defined as the (0001) plane for α-SiC and the (111) plane for 3C-SiC). Second, establish independent growth regions on the polished wafer surface by forming a groove along the boundaries of these selected growth regions. Grooves can be formed by sawing, reactive ion etching, etc. Third, subject the polished surface (including grooves) of the SiC wafer to a suitable pregrowth etch (e.g. a suitable high temperature etch in an $HCl/H_2$ mixture) that will remove all contamination and defects that could act as sites for heterogeneous nucleation of a different SiC polytype, but at the same time will not alter the wafer surface in a manner that would impede subsequent lateral growth from atomic steps on the wafer surface. In addition, the pregrowth etch (treatment) should be carried out such that the topmost atomic plane of each growth region should be located at position of zero (or near zero) tilt angle. Fourth, introduce conditions for intentional heterogeneous nucleation of a selected SiC polytype within each of any number of the growth regions by a suitable means. The nucleation site should be located at the topmost atomic step within a given growth region; the location will be dependent on the misorientation of the wafer. Fifth, grow a SiC film by any suitable means; initially, there will be growth of the original polytype of the wafer along with growth of the selected polytype at the intentionally introduced nucleation sites. Because of the lateral growth parallel to the basal plane, the area of the selected polytype will expand during subsequent growth to eventually cover the total area of the selected growth region. The expansion of the selected polytype will stop at the grooved boundaries. The rate of expansion of the selected polytype is proportional to the rate of film thickness growth and inversely proportional to the tangent of the tilt angle of misorientation of the original growth surface with the basal plane. After a sufficient growth time, each growth region of the wafer will be covered with a single-crystal SiC film of selected polytype. Conventional processes can then be used to fabricate desired SiC devices within each growth region.

In view of the foregoing, it is an object of the present invention to provide new and novel methods of controlling the polytype of SiC films grown on vicinal (0001) SiC wafers.

Another object of the invention is to provide a method of growing low-defect (i.e. elimination of double positioning boundaries (DPBs) and significant reduction in stacking faults) single-crystal 3C films on low-tilt-angle vicinal (0001) 6H wafers.

Another object of the invention is to provide a method of growing low-defect single-crystal 3C films within selected boundaries and 6H films outside these boundaries on the same low-tilt-angle vicinal (0001) 6H wafer.

Another object of the invention is to provide a method of fabricating SiC devices from selected polytypes within selected boundaries of a SiC wafer or SiC crystal substrate.

Another object of the invention is to provide a method of fabricating both 3C-SiC and 6H-SiC devices on the same SiC crystal substrate.

Another object of the invention is to provide a method of fabricating new SiC devices based SiC heterojunctions formed from different polytypes grown on the same SiC crystal substrate.

The foregoing and other objects, advantages and features of the invention, and the manner in which same are accomplished, will become more readily apparent upon the following summary and detailed description of the invention.

DESCRIPTION OF THE DRAWINGS

FIG. 4b illustrates the growth of a SiC film on the wafer shown in FIG. 4a.

DESCRIPTION OF A PREFERRED EMBODIMENT

The process of the invention comprises a sequence of steps. As an example of a preferred embodiment, the chemical vapor deposition of 3C films within selected areas of 6H films on 6H wafers will be described.

The process of the invention can be carried out with a conventional chemical vapor deposition (CVD) system similar to that used in silicon semiconductor technology and familiar to those skilled in the art of semiconductor device fabrication. Process gases commonly used in conventional silicon CVD technology are $H_2$ (used as a carrier gas), $SiH_4$ (used as a source of silicon), HCl (used for cleaning and etching the wafer surface), and various gases used for doping the resulting epitaxial film. For the preferred embodiment, the process of the invention uses $H_2$, $SiH_4$, and HCl. In addition, the process of the invention uses $C_3H_8$ as a source of carbon, nitrogen as an n-type dopant, and trimethylaluminum (TMA) as a p-type dopant. Any CVD system that can deliver these gases to a suitable reaction chamber at the proper flowrates under high purity conditions can be used for the inventive process.

Figure 1:
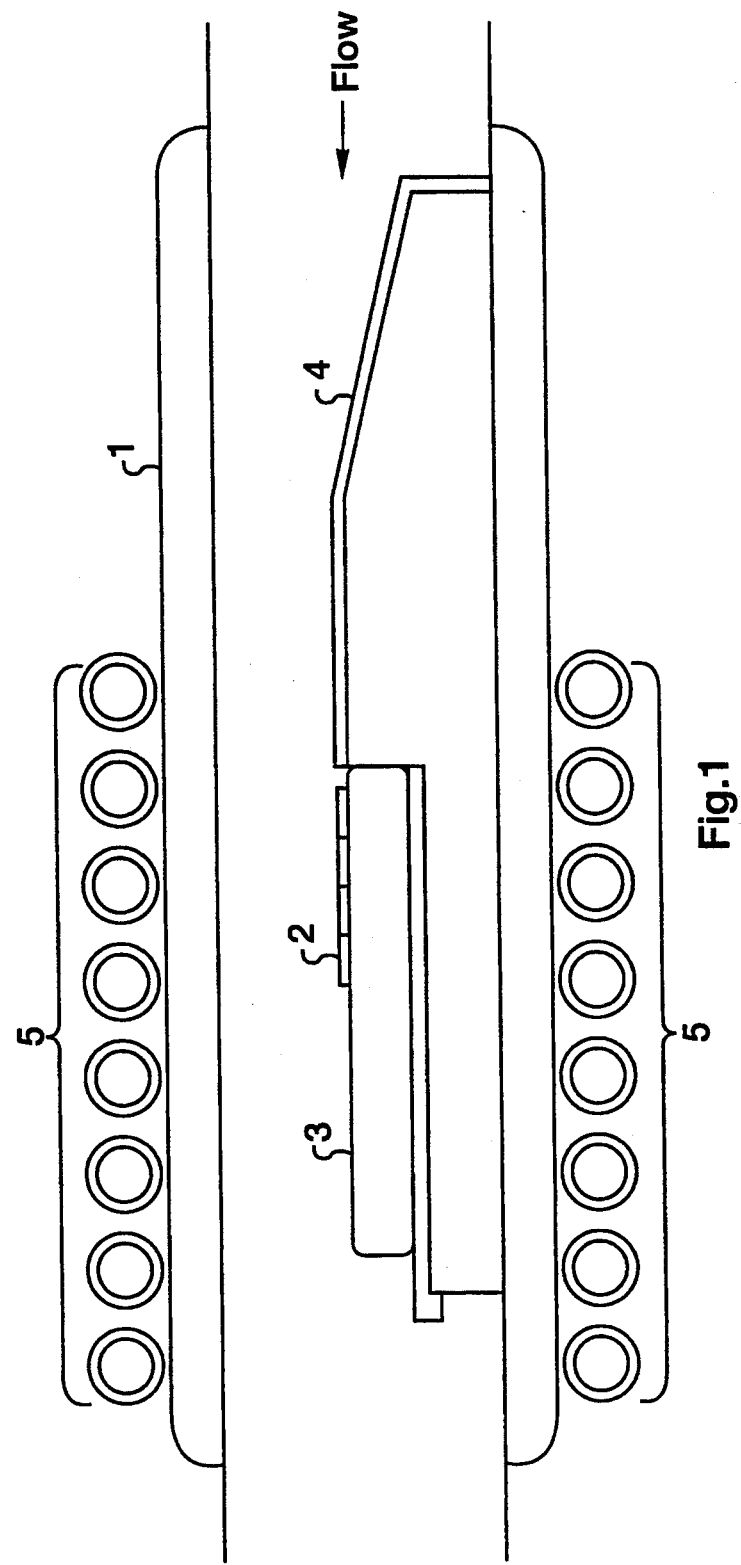
FIG. 1 is a schematic drawing of reaction chamber utilized in the process of the invention.

Referring now to FIG. 1, there is shown a schematic, partial view a suitable reaction chamber 1 for carrying out the process of the invention. Chamber 1 is comprised of a double-walled quartz tube so that the inner quartz tube can be water-cooled. Silicon carbide substrates 2 are supported by a SiC-coated graphite susceptor 3 which in turn is supported by quartz support 4. To produce the desired temperature at the SiC substrates, a radio frequency (RF) induction coil 5 is disposed around chamber 1. The RF field produced by coil 5 heats the susceptor to the desired temperature.

Figure 2:
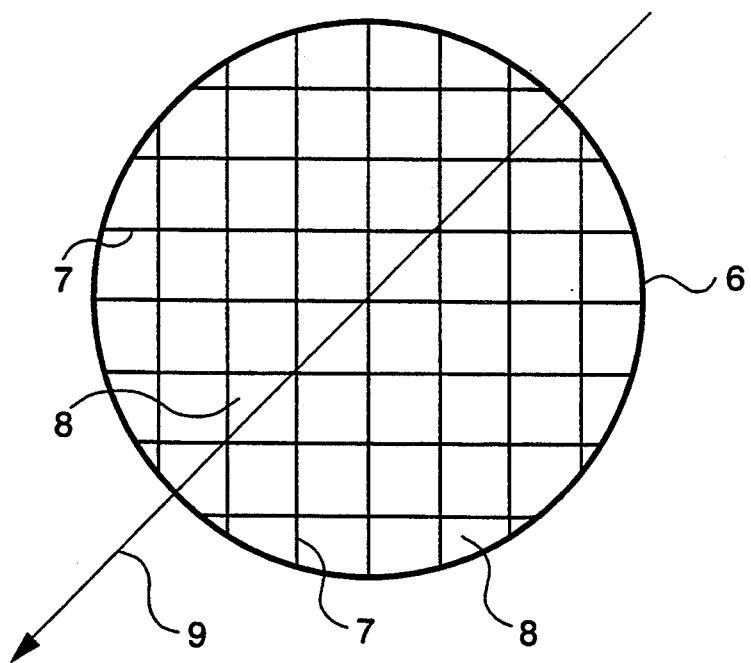
FIG. 2 is a plan-view drawing of a SiC wafer that has been divided into selected growth regions.

The first step of the inventive method comprises preparing a 6H wafer for deposition. Referring now to FIG. 2, a wafer 6 is sliced from a 6H boule such that the wafer surface is misoriented relative to the basal plane by a tilt angle of approximately 0.2°. Wafers with Si faces and C faces have been used successfully. The size of the tilt angle is somewhat determined by the size of the selected growth regions (i.e. the larger the growth area, the smaller the tilt angle). Although either a tilt direction toward <1100> or <1120> can be used, it is expected that further work will determine which direction is the optimum. The wafer is then polished on one face with diamond paste using conventional polishing techniques. Either the Si face or the C face can be polished for growth and used for the preferred embodiment. The choice is determined by the intended use of the SiC film to be grown.

The second step comprises selecting growth regions on the wafer and then forming suitable grooves along the boundaries of these regions. Referring again to FIG. 2, the wafer 1 is shown with lines 7 that outline selected growth regions 8 on the wafer. A practical size for such growth regions could be the size of a particular device that would be fabricated within the region. For example, practical device sizes range from less than a mm to a few mm along an edge. For the preferred embodiment, the grooves along the boundaries are cut with a precision dicing saw with a 25-micrometer-thick blade to minimize crystal damage. The depth of the groove was about 50 micrometers, but a depth of only a few micrometers would also have been satisfactory. An equally satisfactory technique for introducing grooves along the boundary comprises photolithography combined with reactive ion etching. Those skilled in the art of SiC technology are familiar with such techniques. The advantage of photolithography is that boundaries can have arbitrary shape. An additional consideration in the shape and orientation of the growth regions is the tilt direction of the wafer.

Figure 3:
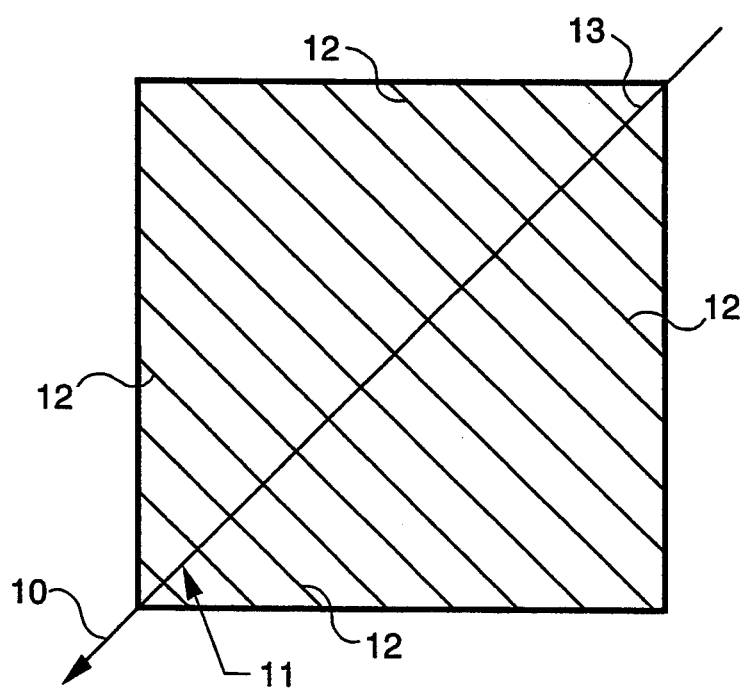
FIG. 3 is a plan-view schematic drawing of a single selected growth region and which has parallel lines illustrating some of the atomic-scale growth steps on the surface.

Referring again to FIG. 2, the tilt direction is indicated by the arrow 9. Referring now to FIG. 3, the tilt direction 10 is shown as an arrow along a diagonal 11 of the growth region. Atomic-scale growth steps 12, indicated by the close-spaced lines, are present on the surface and are perpendicular to the tilt direction. As will be explained in steps 4 and 5, the boundaries of square or rectangular growth region should be oriented such that the tilt direction is along a diagonal of the region.

The third step comprises subjecting the SiC wafer to a pregrowth etch that will remove all contamination, defects, or other surface disturbances that could act as sites for the heterogeneous nucleation of SiC polytypes other than the wafer itself. Such defects are generated in the process of cutting and polishing the wafer, and possibly in the process of cutting grooves along the growth boundaries. In the preferred embodiment, the wafer is subjected to a high temperature gaseous etch in a mixture of HCl and $H_2$ in the reaction chamber of the CVD system in which subsequent growth is carried out. The chamber is a conventional horizontal water-cooled quartz chamber with an inside diameter of 50 mm and which can be used for processing at temperatures up to that required for growth (in this case, about 1450° C.). The SiC wafer is supported and heated by a SiC-coated r.f. heated graphite susceptor. The time, temperature, and HCl concentration are important parameters. Typical conditions for a suitable etch are 25 minutes at 1350° C. with about 3% HCl in the $H_2$ carrier gas with a flow of about 3 l/min. To those skilled in the art of SiC semiconductor technology, other pregrowth treatments, such as oxidation, or reactive ion etching, may also be developed to remove potential sites of unwanted heterogeneous nucleation.

Figure 4A:
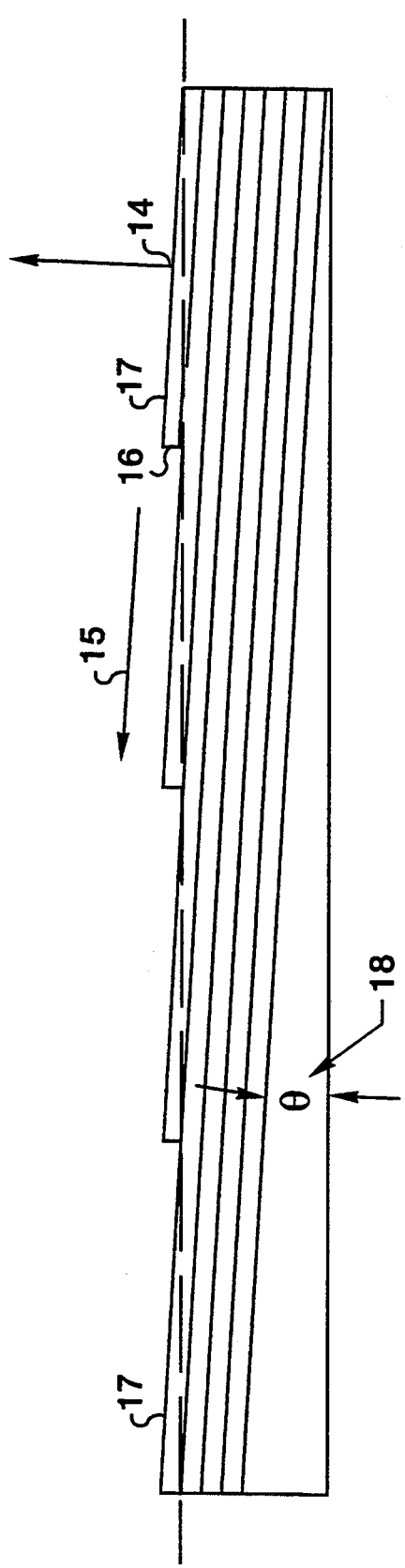
FIG. 4a is a cross-sectional schematic drawing of the wafer surface showing the atomic-scale growth steps.

The fourth step comprises introducing conditions for the intentional heterogeneous nucleation of 3C at a suitable predetermined location within each growth region. This step can be done either in situ or ex situ. Referring to FIGS. 3 and 4a, a suitable predetermined location for the site of heterogeneous nucleation is on the topmost step of the growth region (position 13 in FIG. 3 and position 14 in FIG. 4a). In the preferred embodiment, sites of intentional heterogeneous nucleation are generated by producing localized alterations of the crystal surface. This can be achieved by indenting the surface with a diamond scribe at the predetermined locations. There are many other ways to cause the heterogeneous nucleation of desired polytypes. For example, the surface can be "damaged" and/or material added or subtracted by using an electrical probe of suitable material and striking an arc to the wafer at the proper locations. Another example, would be to use the vapor-liquid-solid (VLS) method of growth to produce a single crystal whisker of some desired polytype. It is well known that some polytypes are impurity stabilized; hence, a rare polytype, such as 2H-SiC, could be initiated. This would allow the growth of 2H-SiC films within selected growth regions.

Figure 4B:
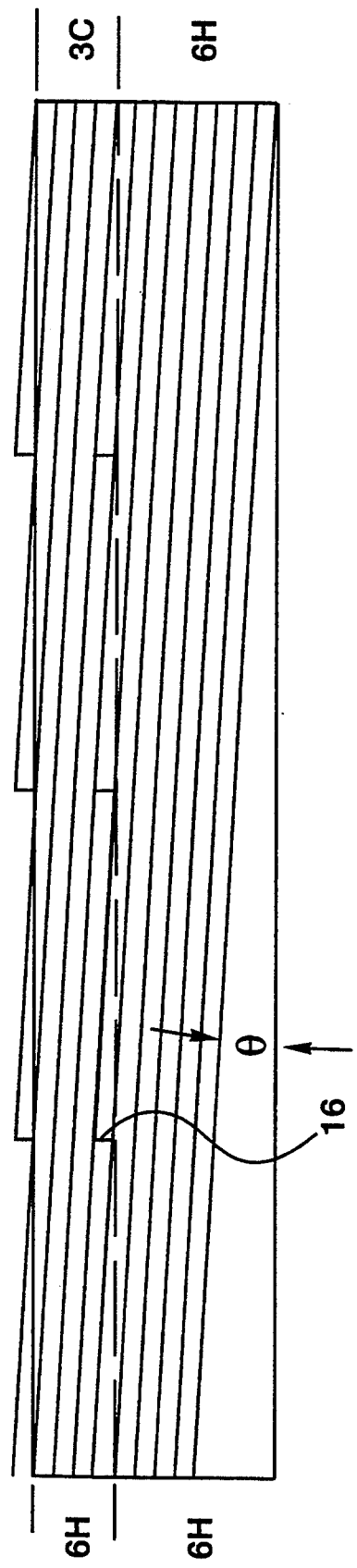

The fifth and final step comprises growing a SiC film on the SiC wafer by some suitable means. Referring now to FIGS. 4a and 4b, the present inventive method teaches that a suitable means will produce a lateral growth of the atomic steps 16 in a direction 15 parallel to the basal plane 17. In addition to the homoepitaxial growth of steps of the original wafer, the site of heterogeneous nucleation 14 will continue to produce growth steps for the desired new polytype. As growth continues, the area of the new polytype will expand to cover the growth region. Referring again to FIG. 4b, the linear expansion rate of the new polytype can be determined from geometrical considerations to be equal to the vertical growth rate divided by the tangent of the wafer tilt angle 18. In the preferred embodiment, films were produced by a suitable CVD process. The 6H wafer with intentionally added nucleation sites for 3C were placed in the CVD reaction chamber described in step three. Conditions for CVD growth were the following: Silane and propane were used as precursors for the Si and C. With a carrier $H_2$ gas flow of 3 l/min at atmospheric pressure, the wafer temperature was increased to the growth temperature of 1450° C. After waiting for about 30 seconds for approximate temperature and flow equilibrium to be reached, silane and propane were added to the carrier gas to initiate SiC growth. With silane and propane concentrations of 300 and 120 ppm in the carrier gas, a vertical film growth rate of about 4 micrometers per hour was achieved. After a growth of one hour on the wafers with a 0.2° tilt angle, 3C regions were observed to have nucleated at the intentionally added indentations and to have grown laterally in the tilt direction by approximately 1 mm. This is in agreement with expansion rate predicted by the present inventive method. Also it was observed that the expansion of the 3C regions was stopped by intentionally introduced grooves cut with the dicing saw.

Figure 5:
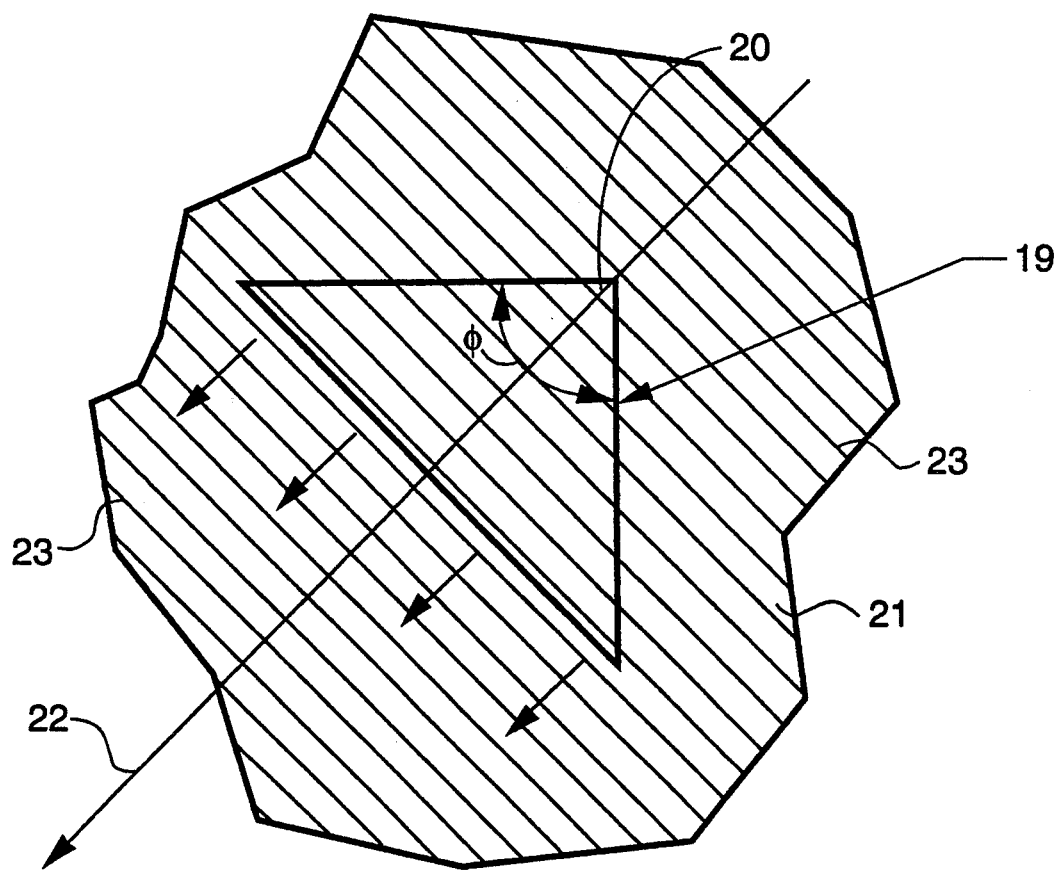
FIG. 5 is a plan-view schematic drawing illustrating the expansion of the 3C growth from a nucleation point on the 6H surface.

Referring now to FIG. 5, the approximate pattern of expansion of the 3C regions 19 from the point of heterogeneous nucleation 20 on the 0.2° wafer surface 21 is shown relative to the tilt direction 22 and the atomic steps 23 on the surface. In addition to the linear expansion, there is an expansion that is parallel to the growth steps. This forms a fan-shaped pattern 19 with an included angle at the nucleation site of approximately 90° From these observations, the inventive method teaches the following in order to achieve maximum coverage of the growth region. The optimum location for the nucleation site is in the corner of the growth region and on the topmost terrace or step. Also, the optimum direction of the wafer tilt is along the diagonal of the growth region.

The five steps described in the foregoing produce 3C films with zero (or near zero) DPBs because nucleation of the 3C film takes place at one location. Also, the stacking faults associated with the DPBs are eliminated. Thus, a low-defect 3C film, suitable for device fabrication is produced within selected growth regions.

The five steps described in the preferred embodiment can be implemented in many ways that are obvious to those skilled in the art.

The inventive method can be applied to the fabrication of semiconductor devices of many kinds. Conventional doping techniques for SiC, such as (1) in situ doping during growth, or (2) ion implantation, can be applied in the fabrication of SiC devices. Other conventional SiC device fabrication processes (e.g. oxidation, reactive ion etching, metallization, etc.) can be used in the fabrication of devices. To those skilled in the art of semiconductor device fabrication, the present inventive method has many applications. Possible devices include (but are not limited to) the following:

(1) 3C devices (e.g. diodes, FETs of all kinds (low frequency, high frequency, high power, etc.), LEDs, etc.)
(2) a mixture of 3C and 6H devices on the same SiC crystal chip.
(3) devices based 3C/6H heterojunctions
(4) devices based on superlattices of various SiC polytypes.

Many modifications of the inventive method are possible without departing from its spirit and scope as set forth in the claims appended hereto. For example, the inventive method could be carried out in a barrel-type CVD system or in an ultra high vacuum system (e.g. a molecular beam epitaxial (MBE) system). This latter approach would allow many new ways (e.g. those involving electron or particle beams) to induce nucleation sites for selected polytypes at selected positions within the selected growth regions.

that which is claimed is:

1. A method of producing device quality, single crystal, SiC film on a SiC substrate, wherein the film is a different selected polytype on selected areas of the substrate and the same polytype on the remaining area of the substrate, said method comprising:
   lapping and polishing a SiC substrate crystal to expose a planar surface, either Si-face or C-face, that is tilted in any direction by any non-zero angle up to 1° with respect to a basal plane;
   defining selected areas on the planar surface wherein heteroepitaxial film growth is desired by introducing grooves on the planar surface by a suitable means along the boundaries of said selected areas;
   removing all unintentional sites of heterogeneous nucleation by a pregrowth etch of the grooved panar surface in an HCl/H$_2$ mixture at a temperature in the range of 1300° C. to 1450° C.;
   introducing a site for intentional heterogeneous nucleation of a hetroepitaxial film at a location within each selected area of desired heteroepitaxial film growth by generating a prescribed localized alteration of the crystal substrate surface;
   depositing an epataxial film over the whole planar surface wherein growth proceeds by a lateral growth at atomic-scale growth steps on the planar surface such that initial growth will be homoepitaxial except at sites of heterogeneous nucleation within the areas selected for heteroepitaxial growth, and such that the areas of heteroepitaxial film will expand as lateral growth continues, and such that the lateral growth of heteroepitaxial films will expand in fan-shaped regions emanating from the sites of heterogeneous nucleation, and such that the general direction of the fan-shaped lateral growth is in the direction of the lateral growth from the growth steps.

2. A method according to claim 1 wherein the polytype of the substrate is 6H-SiC.

3. A method according to claim 1 wherein the polytype of the heteroepitaxial film is 3C-SiC.

4. A method according to claim 1 wherein the grooves along the boundaries of the selected areas of heteroepitaxial growth are produced by cutting with a dicing saw.

5. A method according to claim 1 wherein the grooves along the boundaries of the selected areas of heteroepitaxial growth are produced by photolithography and reactive ion etching that is suitable for SiC.

6. A method according to claim 1 wherein the grooves along the boundaries of the selected areas of heteroepitaxial growth vary in cross-sectional size anywhere in the range from about 1 micrometer wide by 1 micrometer deep to 100 micrometers wide by 100 micrometers deep.

7. A method according to claim 1 wherein the grooves along the boundaries of the selected areas of heteroepitaxial growth are produced by a laser-enhanced photochemical or electrochemical etching process.

8. A method according to claim 1 wherein the temperature of the pregrowth etch is between 1300° C. and 1450° C., the time of the etch is between 2 min and 60 min, and the HCl concentration is between 2% and 5%.

9. A method according to claim 1 wherein the temperature of the pregrowth etch is between 1350° C. and 1400° C., the time of the etch is between 10 min and 30 min, and the Hcl concentration is between 3% and 4%.

10. A method according to claim 1 wherein the temperature of the pregrowth etch is 1350° C., the time of the etch is 25 min, and the HCl concentration is between 3% and 4%.

11. A method according to claim 1 wherein the sites for intentional heterogeneous nucleation are generated by scratching or indenting the surface with a diamond tool.

12. A method according to claim 1 wherein the sites for intentional heterogeneous nucleation are generated by striking an electrical arc from an electrical probe to the surface.

13. A method according to claim 1 wherein the sites for intentional heterogeneous nucleation are generated by heating the surface locally with a high powered pulsed laser, or an electron beam, or an ion beam, or any other suitable form of beamed energy or particles.

14. A method according to claim 1 wherein the sited for intentional heterogeneous nucleation are generated by the introduction of a suitable impurity at the site to stimulate the growth of a desired polytype.

15. A method according to claim 1 wherein the location of the intentional heterogeneous nucleation site is in a corner which includes a topmost step, with respect to the atomic-scale steps, within a selected growth area for heteroepitaxial film growth.

16. A method according to claim 1 wherein the growth is achieved by chemical vapor deposition by introducing a carrier gas, a vaporized silicon-containing material and a vaporized carbon-containing material into the growth chamber while providing sufficient energy to create surface diffusion of silicon and carbon species at the substrate planar surface and establish growth of single-crystal SiC.

17. A method according to claim 1 wherein the growth temperature is maintained at a temperature between 1350° C. to 1700° C.

18. A method according to claim 1 wherein the growth temperature is maintained at a temperature between 1350° C. to 1550° C.

19. A method according to claim 16 wherein the carrier gas is $H_2$.

20. A method according to claim 16 wherein the carrier gas is $H_2$, the vaporized silicon-containing material is a $SiH_4$ source gas and the vaporized carbon-containing material is a $C_3H_8$ source gas.

21. A method according to claim 1 wherein the planar surface of the SiC is tilted toward the <1100> or the <1120> directions.

22. A method according to claim 1 wherein for square or rectangular shaped areas of heteroepitaxial film growth, the areas are oriented such that the tilt direction of the planar surface relative to the basal plane is parallel to a diagonal of the area.

23. A method according to claim 1 wherein the substrate is a waver cut from a single-crystal SiC boule.

24. A method according to claim 1 including the fabrication of one or more 3C-SiC electronic devices on the epitaxial film.

25. A method according to claim 1 including introducing dopants into the growth chamber during epitaxial growth of the single-crystal SiC.

26. A method according to claim 1 including the fabrication of both 3C and 6H electronic devices on the same SiC substrate.

27. A method according to claim 1 including the fabrication of electronic devices of different selected polytypes on the same SiC substrate.

28. A method according to claim 1 wherein the SiC substrate is divided into a regular array of selected growth areas whose boundaries are defined by grooves such that any desired mix of selected areas with selected heteroepitaxial films and with homepitaxial films can be achieved.

29. A method according to claim 1 including the fabrication of one or more electronic devices for each selected growth area.

30. A method according to claim 1 including the fabrication of SiC devices based on heterojunctions created by the heteroepitaxial growth of one SiC polytype on a different polytype.

31. A method according to claim 1 including the fabrication of SiC devices based on superlattice structures created by heteroepitaxial growth of a sequence of different polytypes.

32. A method according to claim 1 including the fabrication of SiC devices based on structures consisting of one or more SiC heterojunctions intersecting one or more p-n junctions that are simultaneously produced during the epitaxial growth and wherein the angle between the heterojunctions and the p-n junctions are equal to the tilt angle of planar surface relative to the basal plane since the heterojuncitons are parallel to the basal plane and the p-n junctions are parallel to the planar surface.

33. A method according to claim 1 including the growth of a seed crystal of any selected polytype for use in the sublimation growth of a large single-crystal boule of that polytype.

34. A method according to claim 33 wherein the selected polytype is 3C-SiC.

35. A method according to claim 1 wherein the polytype of the heteroepitaxial film is 3C-SiC, the substrate is 6H-SiC, and wherein double positioning boundaries (DPBs) are eliminated and the density of stacking faults are reduced.

36. The method of claim 1 wherein the grooves are up to $5\mu$ meters deep.

* * * * *